US011120878B2

United States Patent
Tailliet et al.

(10) Patent No.: US 11,120,878 B2
(45) Date of Patent: Sep. 14, 2021

(54) METHOD FOR WRITING IN EEPROM MEMORY AND CORRESPONDING INTEGRATED CIRCUIT

(71) Applicant: STMicroelectronics (Rousset) SAS, Rousset (FR)

(72) Inventors: François Tailliet, Fuveau (FR); Marc Battista, Allauch (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/857,937

(22) Filed: Apr. 24, 2020

(65) Prior Publication Data
US 2020/0342943 A1    Oct. 29, 2020

(30) Foreign Application Priority Data

Apr. 25, 2019 (FR) ..................... 1904337

(51) Int. Cl.
| | |
|---|---|
| *G11C 16/12* | (2006.01) |
| *G11C 16/04* | (2006.01) |
| *G11C 16/08* | (2006.01) |
| *G11C 16/24* | (2006.01) |
| *G11C 16/30* | (2006.01) |

(52) U.S. Cl.
CPC .......... *G11C 16/12* (2013.01); *G11C 16/0441* (2013.01); *G11C 16/08* (2013.01); *G11C 16/24* (2013.01); *G11C 16/30* (2013.01)

(58) Field of Classification Search
CPC ...... G11C 16/12; G11C 16/0441; G11C 16/08; G11C 16/24; G11C 16/30
See application file for complete search history.

(56) References Cited

U.S. PATENT DOCUMENTS

| | | | | |
|---|---|---|---|---|
| 5,267,209 | A | * | 11/1993 | Yoshida ................. G11C 16/12 257/E27.103 |
| 5,706,228 | A | | 1/1998 | Chang et al. |
| 7,190,623 | B2 | * | 3/2007 | Hsu ..................... G11C 16/0433 257/E21.423 |
| 8,837,221 | B2 | * | 9/2014 | Lee ........................ G11C 16/14 365/185.17 |
| 9,286,982 | B2 | * | 3/2016 | Tran ....................... G11C 16/08 |
| 2012/0063223 | A1 | * | 3/2012 | Lee ..................... G11C 16/0433 365/185.02 |
| 2016/0155506 | A1 | | 6/2016 | Tailliet |

* cited by examiner

*Primary Examiner* — Vanthu T Nguyen
(74) *Attorney, Agent, or Firm* — Slater Matsil, LLP

(57) ABSTRACT

A method for programming a non-volatile memory (NVM) and an integrated circuit is disclosed. In an embodiment an integrated circuit includes a memory plane organized into rows and columns of memory words, each memory word comprising memory cells and each memory cell including a state transistor having a control gate and a floating gate and write circuitry configured to program a selected memory word during a programming phase by applying a first nonzero positive voltage to control gates of the state transistors of the memory cells that do not belong to the selected memory word.

18 Claims, 4 Drawing Sheets

| COL | RG | Bn | Bp | Dn$_i$ | Dp$_i$ | CL$_i$ | WL$_j$ | BL$_{i,k}$ | CG$_{i,j}$ | S |
|---|---|---|---|---|---|---|---|---|---|---|
| unsel | unsel | -6 (+2) | 0 | 0 | 0 | -6 (+2) | 2 (+2) | 2 (+2) | 0 | 2 (+2) |
| unsel | sel | -6 (+2) | 0 | 0 | 0 | 0 | 12 (+2) | 2 (+2) | 0 | 2 (+2) |
| sel | unsel | -6 (+2) | 0 | -6 (+2) | 0 | -6 (+2) | 2 (+2) | 2 / 9 (+2) | 0 | 2 (+2) |
| sel | sel | -6 (+2) | 0 | -6 (+2) | 0 | 0 | 12 (+2) | 2 / 9 (+2) | -6 (+2) | 2 (+2) |

[Fig. 4]

| COL | RG | Bn | BP | Dn | Dp | CL | WL | BL | CG | S |
|---|---|---|---|---|---|---|---|---|---|---|
| unsel | unsel | 4 | 4 | 4 | 4 | 4 | 4 | 4 | 4 | 4 |
| unsel | sel | 4 | 4 | 4 | 4 | 4 | 14 | 4 | 4~2 | 4 |
| sel | unsel | 4 | 4 | 4 | 4 | 4 | 4 | 4/11 | 4 | 4 |
| sel | sel | 4 | 4 | 4 | 4 | 4 | 14 | 4/11 | 4 | 4 |

Vrowglobalprog

METHOD FOR WRITING IN EEPROM MEMORY AND CORRESPONDING INTEGRATED CIRCUIT

CROSS-REFERENCE TO RELATED APPLICATIONS

This application claims priority to French Patent Application No. 1904337, filed on Apr. 25, 2019, which application is hereby incorporated herein by reference.

TECHNICAL FIELD

Embodiments and modes of implementation concern writing to an EEPROM ("electrically erasable and programmable read-only memory") memory, in particular split-voltage programming.

BACKGROUND

Digital data are typically written to EEPROM memories by way of a write cycle comprising an erasure phase and a programming phase.

The EEPROM memory conventionally comprises a memory plane organized into rows and columns of memory words each comprising memory cells.

Conventionally, a memory cell includes a state transistor having a floating gate and a control gate, and an access transistor for transmitting a voltage to the drain of the state transistor.

A memory cell may have two states, defined by the charge of the floating gate, and is thus capable of recording a bit of digital data, for example conventionally a "0" in the erased state and a "1" in the programmed state.

The erasure operations and programming operations are implemented by injections of positive or negative charges through the Fowler-Nordheim effect onto the floating gates of the state transistors of the memory cells.

In particular, the programming operation comprises an injection of (by convention) positive charges onto the floating gate of the state transistor of the memory cell. The memory cell that is programmed is said to be selected.

To inject charges onto the floating gate, a potential difference of the order of 13 V is generated between the control gate and a drain region of the state transistor, for example, conventionally by applying a zero voltage to the control gate and a high-amplitude positive voltage (13 V) to the drain.

For the purpose of reducing the size of the memory cells, what is known as a split-voltage architecture has been proposed, making it possible to reduce the coupling factor and the voltages involved during programming.

The split-voltage architecture proposes to apply a moderate-amplitude negative voltage to the control gate of the state transistor, and a moderate-amplitude positive voltage to the drain region of the state transistor. This makes it possible to achieve the same Fowler-Nordheim electrical field on a state transistor having a lower coupling factor, and with more moderate voltages.

That being said, in split-voltage architectures, as in more conventional architectures, there is in particular a problem of stray programming of unselected cells.

Specifically, positive word line voltages are applied to the gates of access transistors of the memory cells in memory words of unselected rows, in particular in order to avoid leakages and breakdowns in the access transistors. Now, stray positive voltages may be transmitted to the drain of the state transistor, via the access transistors controlled in this way. This may lead to very weak stray tunnel currents whose repetition tends to charge the floating gate of the state transistors, possibly eventually changing a cell initially in the erased state to the programmed state, and thus corrupt a stored item of data. A compromise as to the word line voltage needs to be established with regard to these two problems, and may lead to non-optimum programming conditions.

SUMMARY

Embodiments provide improved split-voltage architecture technologies.

SUMMARY

According to one embodiment, what is proposed is a write method for an electrically erasable and programmable read-only memory comprising a memory plane organized into rows and columns of memory words each comprising memory cells including a state transistor having a control gate and a floating gate, the write method comprising a programming phase comprising, in a selected memory word, possible split-voltage programming of a selected memory cell. Specifically, if the bits to be written to the selected memory word are all "o", no memory cell programming of the selected memory word is performed during the programming phase. In the opposite case, at least one memory cell is selected in the selected memory word in order to perform split-voltage programming there, hence the term "possible".

According to one general feature of this embodiment, a first nonzero positive voltage is applied to the control gates of the state transistors of the memory cells that do not belong to the selected memory word during said programming phase.

By applying the first nonzero positive voltage to the control gates of the state transistors of the unselected memory words during programming, the stray voltages transmitted on the drain of said state transistors are not enough to cause stray programming operations. This improves the robustness of the data storage.

The method according to this embodiment also offers the possibility of establishing a better compromise as to the word line voltage of the unselected rows, and the possibility of using a higher word line voltage for the unselected rows.

The programming may thus be implemented with optimum conditions, without however being subject to problems with stray programming of the state transistors. Plus, if the memory cells include an access transistor, without being subject either to problems with leakage, breakdown, gate stress and drain stress of the access transistors.

Each memory cell may furthermore comprise an access transistor in series with the state transistor and with a respective bit line, the access transistors of one and the same row having their gates coupled to a word line, and, according to one mode of implementation, the bit lines other than the bit line of the selected memory cell and the word lines of the unselected rows are brought to the first nonzero positive voltage during said programming phase.

Specifically, the word line voltage on the unselected rows makes it possible to increase the breakdown voltage limit of the selection transistors of the memory cells (through the gated diode effect). Thus, the voltages applied to selected bit lines may be higher, or the leakage current is lower for a given selected bit line voltage.

The word line voltage on the unselected rows also makes it possible to reduce the gate-drain voltage of the selected transistors, this being beneficial for long-term reliability, in particular in terms of gate oxide degradation.

Furthermore, these advantages are also present for transistors used in elements at the periphery of the memory plane, for example decoders.

Moreover, this mode of implementation also has the advantage of pooling some of the voltages involved on various lines of the memory plane, thereby simplifying the memory, in addition to improving performance.

According to one mode of implementation:

said nonzero positive programming voltage is high enough to bring about optimum programming of the selected memory cell, for example 11 V;

the word line voltage of the selected row allows the selection transistor to transmit said nonzero positive programming voltage, for example 14 V;

the first nonzero positive voltage on the bit lines of the unselected memory cells is high enough so as not to bring about a gate-drain voltage that deteriorates the access transistor, for example 4 V.

This mode of implementation corresponds to programming in an optimum split-voltage architecture. Specifically, in comparison with conventional split-voltage programming operations, this mode of implementation may correspond to an increase in the levels of the programming voltages towards more positive values, and this reduces the risks of degradations through hot carriers. Specifically, higher voltage levels tend to better stop the state transistor from being put into the on state through the substrate effect during programming phases.

The memory plane may contain a source plane or source lines, coupled to a source region of the state transistors, and, according to one mode of implementation, the voltage of the source plane or of the source lines is equal to the first nonzero positive voltage during said programming phase.

Specifically, as the access transistors of the selected row are put into the on state, there may be a passage of current between the bit lines and the source plane (in the case of a programmed cell), and this mode of implementation makes it possible to avoid conflicts between the unselected bit lines and the source plane.

To sum up in a particular example, the control gate voltages of the unselected memory words, the word line voltages of the unselected rows, the bit line voltages of the unselected memory cells, and the source voltage of the source plane are all brought to the same potential, that is to say the first nonzero positive voltage.

For example, the first nonzero positive voltage is between 3 and 5 volts.

This makes it possible to greatly simplify high-voltage switching circuitry configured so as to route the various voltages involved during the programming, while at the same time offering optimum programming conditions, and in particular while minimizing the risks of stray programming.

For example, the split-voltage programming of the selected memory cell comprises applying a nonzero negative programming voltage to the control gate of the state transistor of the selected memory cell, and applying a nonzero positive programming voltage to a drain region of the state transistor of the selected memory cell.

Generally speaking, the activation of the state transistor of a memory cell during programming is characterized primarily by the potential differences between its three control terminals: drain, source, control gate, the potential of the substrate being referenced at 0 V. However, there are a multitude of operating points that meet these conditions, if the voltages of the three terminals are shifted with respect to the substrate potential by a substantially identical value. One difference between these operating points lies in the substrate effect of the state transistor, represented by the source-substrate voltage difference. With all other things being equal, this voltage difference impacts the electrical fields present in the channel of the state transistor during the programming phases, determines the leakage currents in the channel and the generation of hot carriers underneath the floating gate, and therefore the ageing of the state transistor during the programming phases. Thus, a higher source voltage typically has a favorable impact on the ageing of the state transistor.

According to another embodiment, what is proposed is an electrically erasable and programmable read-only memory integrated circuit comprising a memory plane organized into rows and columns of memory words each comprising memory cells including a state transistor having a control gate and a floating gate. The memory comprises write means intended to perform a programming phase comprising, in a selected memory word, possible split-voltage programming of a selected memory cell, and configured so as to apply a first nonzero positive voltage to the control gates of the state transistors of memory cells that do not belong to the selected memory word during said programming phase.

Each memory cell may furthermore comprise an access transistor in series with the state transistor and with a respective bit line, the access transistors of one and the same row having their gates coupled to a word line, and, according to one embodiment, the write means are configured so as to bring the bit lines other than the bit line of the selected memory cell and the word lines of the unselected rows to the first nonzero positive voltage during said programming phase.

According to one embodiment, the write means are configured so as to:

bring said nonzero positive programming voltage to a potential high enough to bring about optimum programming of the selected memory cell, for example 11 V;

bring the word line voltage of the selected row to a potential that allows the selection transistor to transmit said nonzero positive programming voltage, for example 14 V;

bring the first nonzero positive voltage on the bit lines of the unselected memory cells to a potential high enough so as not to bring about a gate-drain voltage that deteriorates the access transistor, for example 4 V.

The memory plane may comprise a source plane or source lines linked to source regions of the state transistors, and, according to one embodiment, the write means are configured so as to bring the potential of the source plane or of the source lines so as to be equal to the first nonzero positive voltage during said programming phase.

According to one embodiment, the first nonzero positive voltage is between 3 and 5 volts.

For example, the write means are configured so as to apply a nonzero negative programming voltage to the control gate of the state transistor of the selected memory cell and so as to apply a nonzero positive programming voltage to a drain region of the state transistor of the selected memory cell during said programming phase.

BRIEF DESCRIPTION OF THE DRAWINGS

Other advantages and features will become apparent on examining the detailed description of completely non-limiting embodiments and modes of implementation, and the appended drawings, in which.

DETAILED DESCRIPTION OF ILLUSTRATIVE EMBODIMENTS

Figure 1:
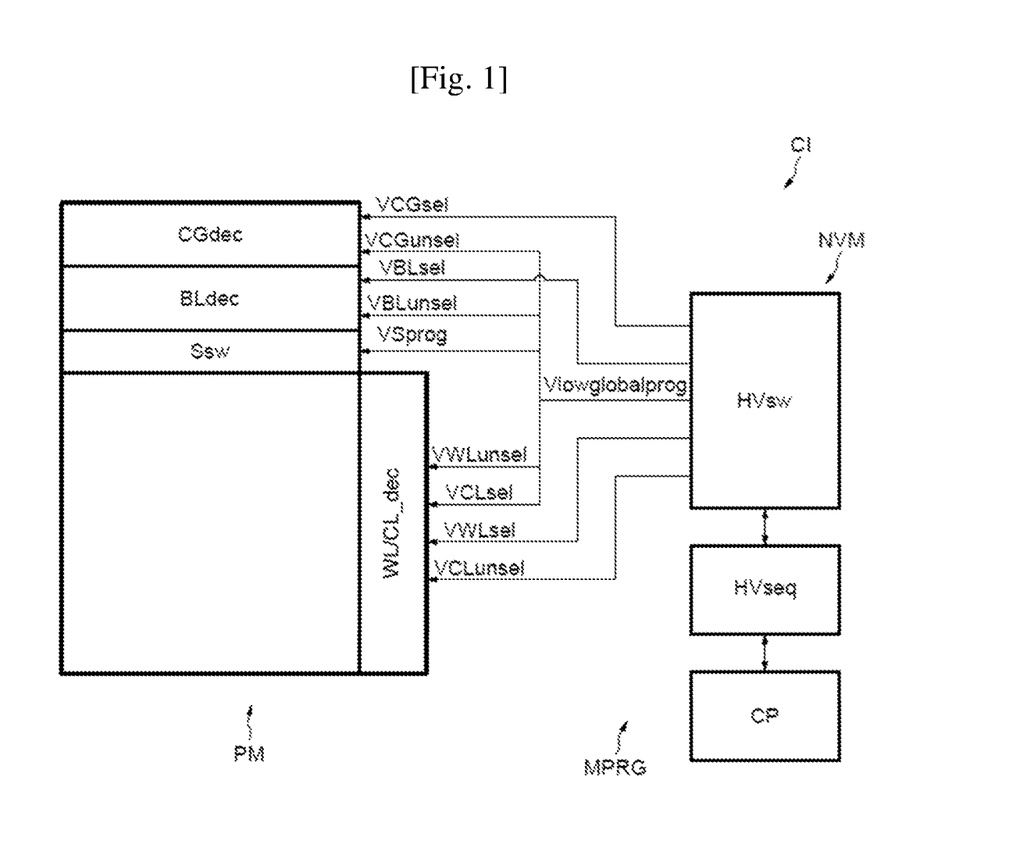
FIG. 1 illustrates one exemplary embodiment.

FIG. 1 schematically shows a non-volatile memory NVM integrated circuit CI.

The non-volatile memory NVM is an electrically erasable and programmable read-only memory "EEPROM", and comprises a memory plane PM organized into rows and columns of memory words. Each memory word comprises memory cells including a state transistor having a control gate and a floating gate (see description below with reference to FIG. 2).

A control gate decoder CGdec makes it possible to route control gate voltages VCGsel, VCGunsel to control gate switches associated with each memory word of the memory plane PM. The control gate switches are controlled so as to transmit one or the other of the control gate voltages VCGsel, VCGunsel to the state transistors of a memory word, using selection signals VCLsel, VCLunsel that are distributed by a row decoder WD/CLdec.

A bit line decoder BLdec makes it possible to route bit line voltages VBLsel, VBLunsel to the memory cells of one of the same column, and selectively to a position of a memory cell within a memory word.

A source switch Ssw makes it possible to route a source voltage VSprog to a source plane linked to all of the sources of the state transistors in the memory plane. Otherwise, source lines running along the columns may also be provided.

Furthermore, the memory NVM includes means for generating and distributing the voltages involved during split-voltage programming, that is to say in particular a charge pump CP for generating voltages from a power supply, for example 5 V. A high-voltage sequencer HVseq makes it possible to temporally coordinate the distribution of the voltages, which are transmitted to a high-voltage switch HVsw distributing said voltages involved during the programming in a manner controlled by the high-voltage sequencer HVseq.

The charge pump CP, the high-voltage sequencer HVseq, the high-voltage switch HVsw, and the row decoder WL/CLdec, the control gate decoder CGdec, the bit line decoder BLdec and the source switch Ssw incorporate write means MRPG, which are in particular intended to perform split-voltage programming operations on selected memory cells.

A memory cell that is programmed is said to be "selected", specifically the programming is selective by memory cell, whereas for example an erasure is selective by memory word. A cell is selected on its row, its column and its bit line.

The term selected may thus in particular define these various elements, and when this involves for example a selected bit line, a selected memory word, a selected row or a selected column, or else a selected state transistor, reference will of course be made to the corresponding element that comprises or that belongs to the selected memory cell.

That being said, a distinction should be drawn with regard to the selected memory words. The memory word that contains a selected memory cell will necessarily be selected, but it may be the case that the selected memory word does not contain any selected memory cell. Specifically, if all of the bits to be written are at 0 (no memory cell programming following the erasure of the memory cells of the selected memory word), the selected memory word does not contain any selected memory cell within the meaning of the term given above.

In other words, a selected memory word belongs to a selected row and to a selected column. An unselected memory word either does not belong to a selected row or does not belong to a selected column, or does not belong either to a selected row or to a selected column.

As will become apparent in more detail below with reference to FIG. 4, the write means are configured so as to apply a first nonzero positive voltage Vlowglobalprog to the control gates of the state transistors of unselected memory cells during said programming.

Furthermore, the example of FIG. 1 corresponds to one advantageous embodiment in which the control gate voltages of the unselected memory words VCGunsel, the selection voltages VCLsel controlling control gate switches of the selected memory word, the word line voltages of the unselected rows VWLunsel, and the bit line voltages of the unselected memory cells VBLunsel and the source voltage VSprog are all brought to said first nonzero positive voltage Vlowglobalprog.

This makes it possible to greatly simplify the circuitry of the high-voltage switches HVsw, of the high-voltage sequencer HVseq and also of the charge pump CP.

In particular, it is the source voltage VSprog that is chosen such that the state transistors have an advantageous source-substrate voltage.

Specifically, for a given operating point of the source, drain and control gate voltages that allows programming, the source-substrate voltage produces an effect on the electrical fields present in the channel of the state transistor during the programming phases, determines the leakage currents in the channel and the generation of hot carriers underneath the floating gate, and therefore the ageing of the state transistor during the programming phases.

Thus, in this advantageous exemplary embodiment, it is the source voltage VSprog that defines the first nonzero positive voltage Vlowglobalprog, the write means MPRG are then configured so as to bring the nonzero positive voltage Vlowglobalprog to the source voltage VSprog of the source plane.

Figure 2:
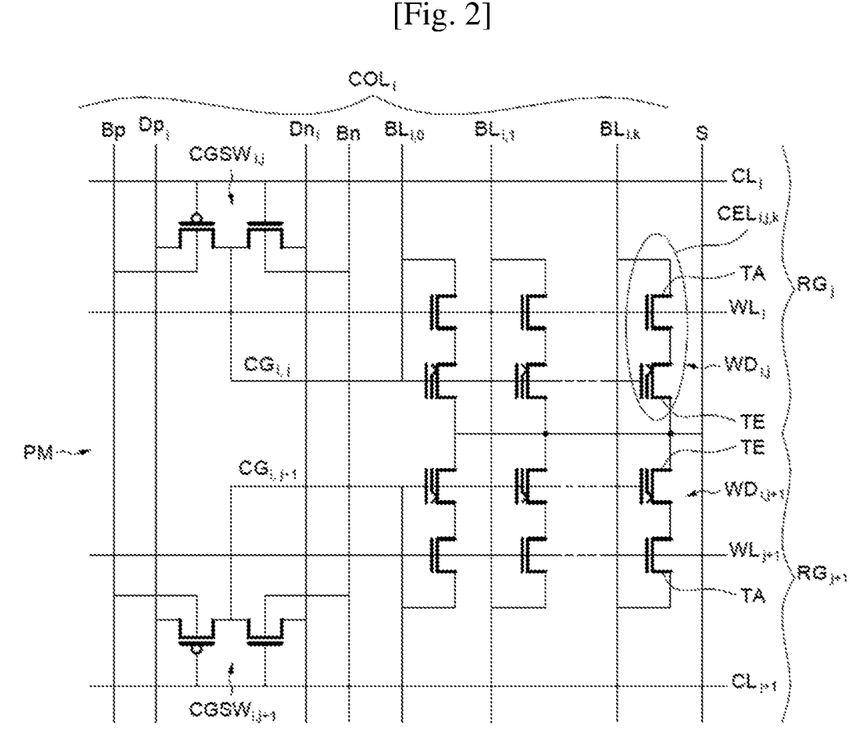
FIG. 2 illustrates one exemplary embodiment.

FIG. 2 illustrates a detail of the memory plane PM of the non-volatile memory NVM integrated circuit CI described above with reference to FIG. 1.

FIG. 2 shows an intersection between a column COLi and two rows RGj, RGj+1 of the memory plane PM. Hereinafter, the indices "i" in the references will indicate belonging to the respective column COLi, and the indices "j" in the references will indicate belonging to the respective row RGj.

A memory word WDi,j, WDi,j+1 is situated at the intersection of a column COLi and a row RGj, RGj+1.

Each memory word WDi,j includes memory cells CELi,j,k, for example, 38 memory cells (4 bytes and 6 bits of error correction code), each including a state transistor TE, and an access transistor TA. Hereinafter, the indices "k" in the references will indicate the position within a column, in particular belonging to a respective bit line BLi,k of a column COLi.

The state transistors TE have a floating gate and a control gate, a source region and a drain region, and the access transistors TA have a gate, a source region and a drain region. The state transistor TE and the access transistor TA of a memory cell CELi,j,k are connected in series and between a respective bit line BLi,k to the drain of the access transistor TA and a common source line S to the source of the state transistor TE. For example, the source line may conventionally be a connection in a metallization level, such as the first metallization level. In some particular cases, the source line S may possibly be a source plane buried in the semiconductor substrate of the integrated circuit, underneath where the transistors of the memory plane are installed.

The control gates of the state transistors TE belonging to the same memory word WDi,j are linked to a control gate line CGi,j, routing a control gate signal from a control gate switch CGSWi,j associated with each memory word WDi,j.

The switch CGSWi,j includes an inverter controlled by a selection signal transmitted on one selection line CLj per row RGj, in relation to p-type and n-type well potentials Bp, Bn applied respectively to the bodies of the p-type and n-type transistors of the inverters of a column COLi. The inverter of the switch CGSWi,j may transmit a first voltage Dpi from the drain of the p-type transistor or a second voltage Dni from the drain of the n-type transistor on the control gate line CGi,j of the memory word WDi,j.

The access transistors TA are controlled by a word line signal, transmitted on a word line WLj coupled to the gates of the access transistors TA of the same row RGj.

Figure 3:
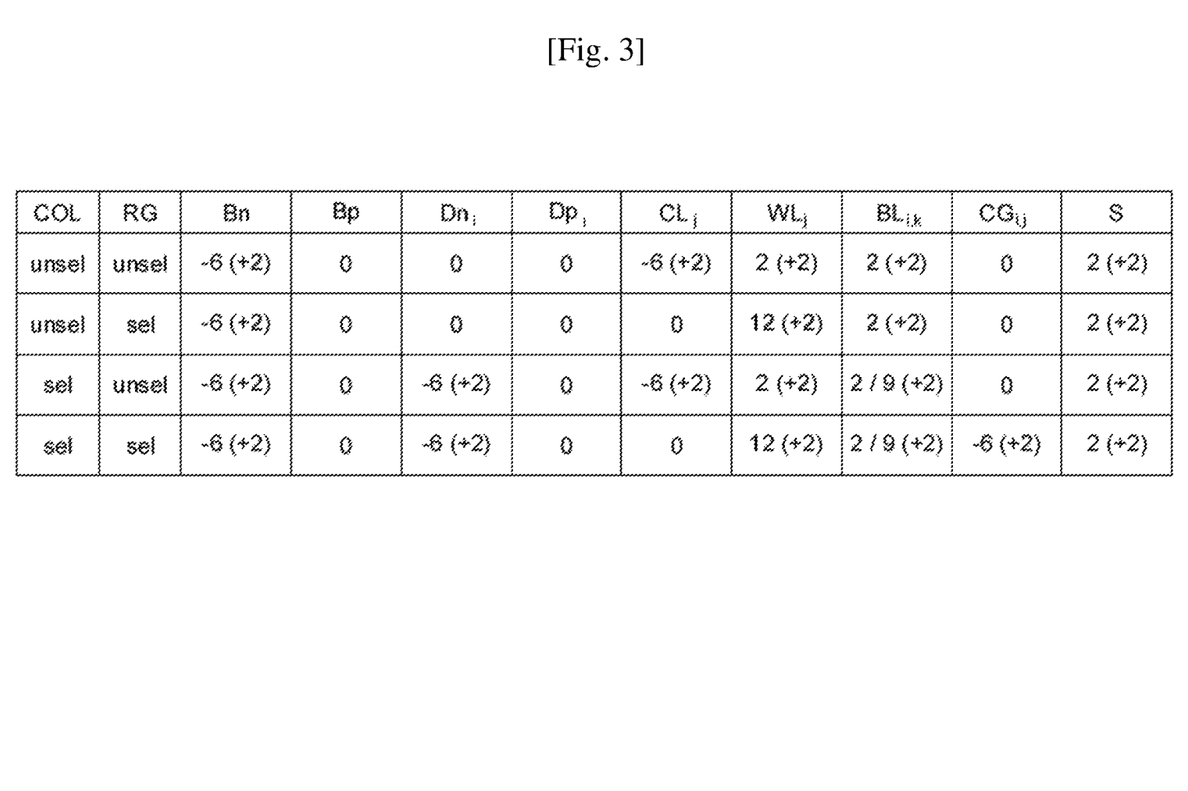
FIG. 3 illustrates one exemplary implementation.
Figure 4:
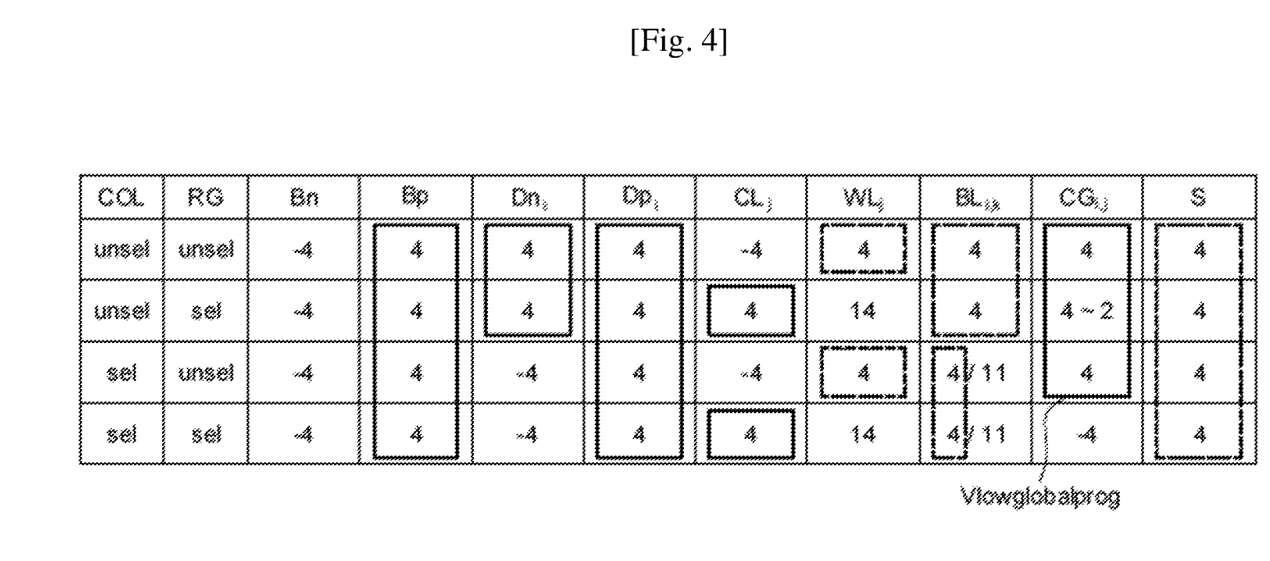
FIG. 4 illustrates one exemplary implementation.

Reference is now furthermore made to FIGS. 3 and 4.

FIG. 3 shows the values, in volts, of the voltages involved in the memory plane PM of FIG. 2, so as to implement conventional split-voltage programming, whereas FIG. 4 shows the values of the same voltages according to one advantageous mode of implementation.

The tables of FIGS. 3 and 4 show the values of the various voltages for implementing the programming operations, depending on whether the column COL is selected "COL(sel)" or unselected "COL(unsel)" and whether the row RG is selected "RG(sel)" or unselected "RG(unsel)".

FIGS. 3 and 4 thus show the potentials of the n-type and p-type wells Bn and Bp, drain voltages Dni, Dpi, and the selection signals of the selection lines CLj involved in the control gate switches CGSWi,j. The word line voltages WLj, the bit line voltages BLi,k, the control gate voltages CGi,j and the source voltages S are also shown.

FIG. 3 shows values of the voltages for implementing programming using a basic split-voltage principle. A non-zero negative programming voltage at −6 V is applied to the control gate of the state transistor TE of the selected memory cell CELi,j,k, and a nonzero positive programming voltage at 9 V is applied to the drain region of the state transistor TE of the selected memory cell CELi,j,k, via the corresponding bit line BLi,k.

This brings about a voltage of −15 V between the control gate and the drain region of the state transistor TE of the selected memory cell, enough to implement a Fowler-Nordheim phenomenon of charge injection onto the floating gate.

To apply the negative programming voltage at −6 V to the control gate CGi,j of the state transistor, a high-level selection signal, at 0 V, is communicated on the selection line CLj of the selected row RG(sel), the negative programming voltage at −6 V is communicated on the line Dni of the selected columns COL(sel) and in the n-type wells Bn of the inverters CGSWi,j. The n-type transistor of the inverter CGSWi,j of the selected memory word WDi,j is thus put into the on state and transmits the negative programming voltage at −6 V from its drain to the control gate line CGi,j of the selected memory word.

To apply the positive programming voltage at 9 V to the drain region of the state transistor TE of the selected memory cell CELi,j,k, the respective bit line BLi,k, in the selected columns COL(sel), is brought to the positive programming voltage of 9 V. The other bit lines of the selected columns are brought to a lower positive voltage, 2 V in this example. The word line voltage WLj of the selected row RG(sel) is brought to 12 V so as to put the access transistors TA of the selected memory word WDi,j into the on state, given a voltage of 9 V on the drain of one of them. The positive programming voltage at 9 V on the bit line BLi,k is thus transmitted to the drain of the selected state transistor TE, via the access transistor TA of the selected memory cell CELi,j,k.

Out of the voltages in the table of FIG. 3, positive voltages of at least 2 V are applied to the bit lines BLi,k of the unselected memory cells, in particular so as to prevent leakage currents between the selected bit line and the unselected bit lines (for example in the substrate between two drain regions of access transistors).

Furthermore, the access transistors TA of the unselected memory cells of the selected row RG(sel) receive a voltage of 12 V on their gates, and applying the positive voltages at 2 V also makes it possible to reduce a gate stress of these access transistors TA. The gate stress corresponds to voltages between the gate and the drain of greater than 12 V, or even 10 V to benefit from a significant margin, Vg−Vd>10 V (Vg being the potential of the gate and Vd being the potential of the drain), and prematurely ages the transistors.

Therefore, as the access transistors TA of the selected row are put into the on state at 12 V, there could be a passage of current between the unselected bit lines at 2 V and the source plane (in particular in the case of an already programmed cell). To avoid conduction from the bit line to the source in the memory cells during programming, the source voltage is equal to the unselected bit line voltage, 2 V.

Moreover, the access transistors TA of the memory cells of the unselected rows RG(unsel) on the selected bit line receive the positive programming voltage of 9 V on their drain and an unselected word line voltage on their gate. To reduce a drain stress and minimize the drain-channel leakages of these transistors, a positive voltage of at least 2 V is applied to the unselected word lines. Specifically, the drain stress typically causes leakage currents between the drain and the channel of the transistor, through a mechanism usually known as GIDL, for gate-induced drain barrier lowering. These leakage currents occur at voltages lower than the avalanche voltage of the drain/substrate diode of the transistor. Increasing the gate voltage cancels out these leakage currents and is beneficial to the ageing of the transistor.

That being said, a high enough unselected word line voltage may increase the source voltage of the access transistor TA to the point of generating stray programming operations on the drain of the state transistor TE (even unselected, that is to say not receiving the negative programming voltage on its control gate). To avoid stray programming operations, the unselected word line voltage is less than 3 V.

In summary, the compromise for applying the moderate positive voltage to the unselected word lines WLj is situated between 2 V and 3 V.

Now, it would be desirable to be able to implement more effective programming conditions, for example in which the split voltage levels are increased overall (are "more positive"), for example −4 V and 11 V instead of −6 V and 9 V, as represented by the "(+2)" in the corresponding cells of the table of FIG. 3.

Specifically, considering that the floating gate potential is coupled to the control gate potential to an extent of 70% and to the drain potential to an extent of 30%, and that the positive programming charge is 1 V, the effective floating gate potential in the initial case described above is −6*0.7+9*0.3+1=−0.5 V. With a negative effective potential in the floating gate, the state transistor is more inclined to be subject to injections of hot carriers into the floating gate oxide through the channel, and this causes premature ageing of the memory cell.

Now, with voltage levels increased by 2 V (+2), the effective floating gate potential is −4*0.7+11*0.3+1=1.5 V. With a positive effective potential in the floating gate, the state transistor is less inclined to be subject to injections of hot carriers into the floating gate oxide through the channel, higher voltages tending to better stop the state transistor from being put into the on state, through the substrate effect. This improves the reliability of the memory cells.

Therefore, for a given drain-source voltage (the drain-source voltage is substantially identical between the initial split-voltage conditions of FIG. 3 and the conditions at increased voltage levels "(+2)"), a higher source voltage, made possible by the positive shifting of the voltages, tends to oppose the piercing (stray drain-source conduction) of the state transistor, which piercing is a source of hot carrier generation.

The higher effective floating gate potential (at 1.5 V hereinabove) will avoid the injection of these hot carriers, holes in this case, into the gate oxide of the state transistors, through the cumulative effects of having less hot carrier generation, and these are not directed towards the gate oxide.

To comply with the Fowler-Nordheim electrical field constraints, bit line leakage constraints and gate stress and drain stress constraints for the access transistors TA, the bit line voltages BLj and the word line voltages WLj are all increased by 2 V (as are the voltages for applying them Bn, Dn, CLj).

However, the most effective programming conditions in FIG. 3 (+2) involve a voltage on the drains of the state transistors of the unselected memory cells of at least 4 V, which is above the tolerance in terms of stray programming, and this is unacceptable.

Reference is now made to FIG. 4, which shows an example of more effective and optimum programming conditions, made possible by applying the first nonzero positive voltage Vlowglobalprog to the control gates CGi,j of the state transistors of the unselected memory cells.

The first nonzero positive voltage Vlowglobalprog may be between 3 V and 5 V, and 4 V will be chosen arbitrarily to describe this example. The first nonzero positive voltage Vlowglobalprog may be denoted by "the voltage Vlowglobalprog" for conciseness.

The values framed in an unbroken line in the table of FIG. 4 make it possible to apply the voltage Vlowglobalprog to the control gates of the unselected cells.

To apply the negative programming voltage at −4 V and the voltage Vlowglobalprog at 4 V to the various control gates CGi,j, a high-level selection signal at 4 V is communicated on the selection line CLj of the selected row RG(sel), and a low-level selection signal at −4 V is applied to the selection line CLj of the unselected rows RG(unsel).

The n-type wells Bn of the inverters CGSWi,j are negatively biased at −4 V and the power supply lines Dn of the n-type transistors of the inverters CGSWi,j are brought to −4 V in the selected columns COL(sel) and to 4 V in the unselected columns COL(unsel).

The p-type wells Bp of the inverters CGSWi,j are positively biased at 4 V and the drain lines Dp of the p-type transistors of the inverters CGSWi,j are brought to 4 V in the selected columns COL(sel) and in the unselected columns COL(unsel).

Thus, in the selected row RG(sel), the high-level selection signal CLj puts the n-type transistors of the inverters CGSWi,j into the on state, transmitting the negative programming voltage of −4 V into the selected columns COL(sel) and the voltage Vlowglobalprog into the unselected columns COL(unsel), from the respective lines Dn, which, due to the substrate effect in the n-type transistors, is transmitted at substantially 2 V.

In the unselected rows RG(unsel), the low-level selection signal CLj puts the p-type transistors of the inverters CGSWi,j into the on state, transmitting the voltage Vlowglobalprog of 4 V into the selected columns COL(sel) and the unselected columns COL(unsel), from the drain lines Dp.

In summary, the negative programming voltage is applied to the control gate of the selected state transistor, whereas the first nonzero positive voltage Vlowglobalprog is applied to the control gates of the state transistors of the memory cells that do not belong to the selected memory word.

This additionally makes it possible, without introducing stray programming, to increase the word line voltages WLj of the unselected rows and the bit line voltages BLi,k of the unselected memory cells during said programming.

The breakdown voltage limit of the selection transistors TA is thus increased through the gated diode effect, and the voltages applied to selected bit lines may be higher, in this example at 11 V, and/or the current leakages may be lower in these transistors.

The gate-drain voltage of the selected transistors is also reduced, thereby making it possible to limit degradations of the gate oxide of the access transistors.

Furthermore, transistors used in elements at the periphery of the memory plane that route the voltages during the programming, for example into the bit line decoders BLdec (FIG. 1) and into the row decoders WL/CLdec (FIG. 1), benefit from these same advantages.

Furthermore, the biasing of the source plane S is equal to the first nonzero positive voltage Vlowglobalprog.

Thus (with reference to FIG. 1, and as framed in unbroken and broken lines in FIG. 4), the unselected bit line voltages VBLunsel, the unselected control gate voltages VCGunsel, the unselected word line voltages VWLunsel, the control signal voltages of the selected row VCLsel and the source voltage VSprog are all at a low-level overall programming potential, that is to say the first nonzero positive voltage Vlowglobalprog.

This makes it possible, in addition to producing optimum programming conditions that comply in particular with the tolerances in terms of stray programming, to greatly simplify the architecture and the control of the high-voltage switch HVsw (FIG. 1) distributing the voltages in order to implement split-voltage programming.

What is claimed is:
1. A method for programming a non-volatile memory (NVM) comprising a memory plane organized in rows and columns of memory words, each memory word comprising memory cells, the method comprising:
   programming a selected memory word, during a programming phase, by applying a first nonzero positive volt- age to control gates of state transistors of the memory cells that do not belong to the selected memory word, wherein each memory cell includes a state transistor having a control gate and a floating gate, and an access transistor in series with the state transistor connected to a respective bit line; and applying, during the programming phase, the first nonzero positive voltage to bit lines other than a bit line of a selected memory cell and word lines of the unselected rows, wherein gates of access transistors of the same row are coupled to a word line.

2. The method according to claim 1, further comprising:
selecting a word line voltage of a selected row so that the access transistor is able to pass a nonzero positive programming voltage; and
programming the selected memory cell with the nonzero positive programming voltage,
wherein the first nonzero positive voltage on the bit lines of the unselected memory cells is high enough so that a gate-drain voltage does not deteriorate the access transistor.

3. The method according to claim 2, wherein the nonzero programming voltage is 11 V, wherein the word line voltage is 14 V, and wherein the first nonzero positive voltage is 4 V.

4. The method according to claim 1, further comprising:
applying, during the programming phase, a source voltage to a source plane or source lines, wherein the source voltage is equal to the first nonzero positive voltage, and wherein the memory plane comprises the source plane or the source lines coupled to source regions of the state transistors.

5. The method according to claim 1, wherein the first nonzero positive voltage is between 3 and 5 volts.

6. The method according to claim 1, wherein the programming is a split-voltage programming of a selected memory cell, wherein the split-voltage programming comprises applying a nonzero negative programming voltage to a control gate of a state transistor of the selected memory cell, and applying a nonzero positive programming voltage to a drain region of the state transistor of the selected memory cell.

7. A non-volatile memory (NVM) integrated circuit comprising:
a memory plane organized into rows and columns of memory words, wherein each memory word comprises memory cells and each memory cell includes a state transistor having a control gate and a floating gate, wherein each memory cell further comprises an access transistor in series with the state transistor connected to a respective bit line, and wherein access transistors of the same row have their gates coupled to a word line; and
a write circuit configured to:
program a selected memory word during a programming phase by applying a first nonzero positive voltage to control gates of the state transistors of the memory cells that do not belong to the selected memory word; and
apply the first nonzero positive voltage to bit lines other than a bit line of a selected memory cell and word lines of unselected rows during the programming phase.

8. The integrated circuit according to claim 7, wherein the write circuit is configured to:
provide a nonzero positive programming voltage with a potential to provide programming of the selected memory cell;
provide a word line voltage of a selected row with a potential that allows the access transistor to pass the nonzero positive programming voltage; and
provide the bit lines of the unselected memory cells with the first nonzero positive voltage so that a gate-drain voltage does not deteriorate the access transistor.

9. The integrated circuit according to claim 8, wherein the nonzero programming voltage is 11 V, wherein the word line voltage is 14 V, and wherein the first nonzero positive voltage is 4 V.

10. The integrated circuit according to claim 7, wherein the memory plane comprises a source plane or source lines linked to source regions of the state transistors, and wherein the write circuit is configured to provide the source plane or the source lines with the first nonzero positive voltage during the programming phase.

11. The integrated circuit according to claim 7, wherein the first nonzero positive voltage is between 3 and 5 volts.

12. The integrated circuit according to claim 7, wherein the write circuit is configured to:
apply a nonzero negative programming voltage to the control gate of the state transistor of a selected memory cell; and
apply a nonzero positive programming voltage to a drain region of the state transistor of the selected memory cell during the programming phase.

13. A non-volatile memory (NVM) integrated circuit comprising:
a memory plane organized into rows and columns of memory words, wherein each memory word comprises memory cells and each memory cell includes a state transistor having a control gate and a floating gate; and
a write circuit configured to:
program a selected memory word during a programming phase by applying a first nonzero positive voltage to control gates of the state transistors of the memory cells that do not belong to the selected memory word; and
apply the first nonzero positive voltage to bit lines other than a bit line of a selected memory cell and word lines of unselected rows during the programming phase.

14. The integrated circuit according to claim 11, wherein the write circuit is configured to:
provide a nonzero positive programming voltage with a potential to provide programming of the selected memory cell;
provide a word line voltage of a selected row with a potential that allows an access transistor to pass the nonzero positive programming voltage; and
provide the bit lines of the unselected memory cells with the first nonzero positive voltage so that a gate-drain voltage does not deteriorate the access transistor.

15. The integrated circuit according to claim 14, wherein the nonzero programming voltage is 11 V, wherein the word line voltage is 14 V, and wherein the first nonzero positive voltage is 4 V.

16. The integrated circuit according to claim 11, wherein the memory plane comprises a source plane or source lines linked to source regions of the state transistors, and wherein the write circuit is configured to provide the source plane or the source lines with the first nonzero positive voltage during the programming phase.

17. The integrated circuit according to claim 11, wherein the first nonzero positive voltage is between 3 and 5 volts.

18. The integrated circuit according to claim 11, wherein the write circuit is configured to:

apply a nonzero negative programming voltage to the control gate of the state transistor of the selected memory cell; and apply a nonzero positive programming voltage to a drain region of the state transistor of the selected memory cell during the programming phase.

\* \* \* \* \*

UNITED STATES PATENT AND TRADEMARK OFFICE
CERTIFICATE OF CORRECTION

PATENT NO. : 11,120,878 B2  
APPLICATION NO. : 16/857937  
DATED : September 14, 2021  
INVENTOR(S) : François Tailliet et al.

Page 1 of 1

It is certified that error appears in the above-identified patent and that said Letters Patent is hereby corrected as shown below:

In the Claims

Claim 14, Column 12, Line 43; delete "11" and insert --13--.

Claim 16, Column 12, Line 58; delete "11" and insert --13--.

Claim 17, Column 12, Line 64; delete "11" and insert --13--.

Claim 18, Column 12, Line 66; delete "11" and insert --13--.

Signed and Sealed this  
Twenty-sixth Day of October, 2021

Drew Hirshfeld  
*Performing the Functions and Duties of the*  
*Under Secretary of Commerce for Intellectual Property and*  
*Director of the United States Patent and Trademark Office*